United States Patent
Kim et al.

(10) Patent No.: US 11,690,257 B2
(45) Date of Patent: Jun. 27, 2023

(54) DISPLAY DEVICE AND MANUFACTURING METHOD THEREOF

(71) Applicant: Samsung Display Co., LTD., Yongin-si (KR)

(72) Inventors: Jae Sik Kim, Hwaseong-si (KR); Woo Yong Sung, Seoul (KR); Byoung Kwon Choo, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/903,003

(22) Filed: Sep. 5, 2022

(65) Prior Publication Data

US 2022/0415985 A1    Dec. 29, 2022

Related U.S. Application Data

(62) Division of application No. 17/019,445, filed on Sep. 14, 2020, now Pat. No. 11,437,450.

(30) Foreign Application Priority Data

Mar. 13, 2020   (KR) .................... 10-2020-0031526

(51) Int. Cl.
| | | |
|---|---|---|
| H01L 27/32 | (2006.01) | |
| H10K 59/123 | (2023.01) | |
| H10K 71/00 | (2023.01) | |
| H10K 71/20 | (2023.01) | |
| H10K 59/12 | (2023.01) | |
| H10K 102/00 | (2023.01) | |
| H10K 102/10 | (2023.01) | |

(52) U.S. Cl.
CPC ........... *H10K 59/123* (2023.02); *H10K 71/00* (2023.02); *H10K 71/20* (2023.02); *H10K 59/1201* (2023.02); *H10K 2102/00* (2023.02); *H10K 2102/103* (2023.02)

(58) Field of Classification Search
CPC ............................ H10K 59/123; H10K 71/00
See application file for complete search history.

(56) References Cited

U.S. PATENT DOCUMENTS

| | | |
|---|---|---|
| 5,952,243 A | 9/1999 | Forester et al. |
| 2006/0211181 A1 | 9/2006 | Chung |
| 2016/0172370 A1 | 6/2016 | Makala et al. |
| 2018/0114819 A1 | 4/2018 | Kang et al. |
| 2019/0157627 A1 | 5/2019 | Bae et al. |
| 2020/0048551 A1 | 2/2020 | Tsai et al. |
| 2021/0082955 A1 | 3/2021 | Rajashekhar et al. |
| 2021/0313228 A1 | 10/2021 | Nguyen et al. |

FOREIGN PATENT DOCUMENTS

| | | |
|---|---|---|
| KR | 1020120080901 A | 7/2012 |
| KR | 101781549 B1 | 9/2017 |
| KR | 1020190060019 A | 6/2019 |

*Primary Examiner* — Douglas M Menz
(74) *Attorney, Agent, or Firm* — Cantor Colburn LLP

(57) ABSTRACT

A display device includes: a substrate; an inorganic insulating layer disposed on the substrate; a conductor disposed on the inorganic insulating layer; and an organic insulating layer disposed on the conductor, where an opening is defined through the organic insulating layer to expose a part of the upper surface of the conductor, and at least one material selected from a siloxane, a thiol, a phosphate, a disulfide including a sulfur series, and an amine is bonded on the part of the upper surface of the conductor exposed through the opening.

12 Claims, 9 Drawing Sheets

DISPLAY DEVICE AND MANUFACTURING METHOD THEREOF

This application is a divisional of U.S. patent application Ser. No. 17/019,445, filed on Sep. 14, 2020, which claims priority to Korean Patent Application No. 10-2020-0031526, filed on Mar. 13, 2020, and all the benefits accruing therefrom under 35 U.S.C. § 119, the content of which in its entirety is herein incorporated by reference.

BACKGROUND

(a) Field

The disclosure relates to a display device and a manufacturing method thereof.

(b) Description of the Related Art

A display device as device for displaying an image may include a liquid crystal display, an organic light emitting diode display, and the like.

The organic light emitting diode display typically includes a plurality of transistors disposed on a substrate, a driving element including a plurality of conductors, and an organic light emitting element. The organic light emitting element may include two electrodes facing each other and an organic emission layer interposed therebetween. Electrons and holes provided from the two electrodes recombine in the organic emission layer to generate excitons, and the generated excitons change from an excited state to a ground state and then light may be emitted.

SUMMARY

In an organic light emitting diode display, a surface of an organic insulating layer covering a driving element may be planarized to easily control the thickness of a pixel electrode and an emission layer to improve luminance uniformity of the light emitted from the organic light emitting element.

In such an organic light emitting diode display, a chemical mechanical polishing method, in which mechanical polishing and chemical polishing are performed together, may be used to planarize the surface of the organic insulating layer. A device that performs a chemical mechanical polishing may include a polishing pad, a chuck that fixes and rotates a substrate as a polishing target to be polished, and a slurry dispenser that supplies a slurry as basic constituent elements. In some cases, the substrate is fixed, and the polishing pad is rotated to perform the planarization process.

Embodiments of the invention relate to a display device in which a slurry, by-products, and the like is effectively prevented from remaining in a conductor of a driving element after a polishing process of an organic insulating layer is performed.

An embodiment of a display device according to the invention includes: a substrate; an inorganic insulating layer disposed on the substrate; a conductor disposed on the inorganic insulating layer; and an organic insulating layer disposed on the conductor, where an opening is defined through the organic insulating layer to expose a part of the upper surface of the conductor, and at least one material selected from a siloxane, a thiol, a phosphate, a disulfide including a sulfur series, and an amine is bonded on the part of the upper surface of the conductor exposed through the opening.

In an embodiment, the conductor may include at least one material selected from titanium (Ti), iron (Fe), nickel (Ni), copper (Cu), molybdenum (Mo), indium tin oxide ("ITO"), and indium zinc oxide ("IZO").

In an embodiment, the substrate may include a display area and a non-display area surrounding the display area, and the conductor may include a first conductor disposed in the display area and a second conductor disposed in the non-display area.

In an embodiment, the display device may further include a pixel electrode disposed on the organic insulating layer in the display are, an emission layer disposed on the pixel electrode in the display are, and a common electrode disposed on the emission layer in the display are, where the at least one material selected from the siloxane, the thiol, the phosphate, the disulfide including the sulfur series, and the amine may be disposed between the pixel electrode and the first conductor.

In an embodiment, the display device may further include a semiconductor layer disposed on the substrate in the display area, a gate insulating layer disposed on the semiconductor layer in the display area, a gate conductor disposed on the semiconductor layer in the display area, and a data conductor disposed on the gate conductor in the display area, where the data conductor may be defined by the first conductor, and the inorganic insulating layer may be disposed between the gate conductor and the data conductor.

In an embodiment, the first conductor may be electrically connected to the pixel electrode through the opening of the organic insulating layer.

In an embodiment, the gate conductor may include a gate electrode, the data conductor may include a drain electrode and a source electrode, and the gate electrode, the drain electrode, the source electrode and the semiconductor layer may collectively define a transistor.

An embodiment of a manufacturing method of a display device according to the invention includes: providing a conductor on a substrate; providing an organic insulating layer on the conductor and forming an opening through the organic insulating layer to expose a part of an upper surface of the conductor; depositing a sacrificial layer to cover a surface of the organic insulating layer and the part of the upper surface of the conductor exposed through the opening; polishing an upper surface of the organic insulating layer; and surface-treating the sacrificial layer on a side surface of the organic insulating layer and the upper surface of the conductor, where the sacrificial layer includes a self-assembled monolayer.

In an embodiment, the self-assembled monolayer may include a head group, a hydrocarbon chain and a terminal functional group, and the head group may include at least one selected from a siloxane, a thiol, and a phosphate.

In an embodiment, the terminal functional group may include at least one selected from a trifluoromethyl (—$CF_3$), a difluorocarbene (—$CF_2$), a methyl (—$CH_3$), a methylene (—$CH_2$), a fluoro (—F), a hydroxyl group (—OH), carbon (—C), and silicon (—Si).

In an embodiment, the sacrificial layer may be deposited by a thermal evaporation, a liquid coating, a chemical vapor deposition, a physical vapor deposition, or a sputtering.

In an embodiment, the upper surface of the organic insulating layer covered by the sacrificial layer may include protrusions and depressions.

In an embodiment, the head group may be disposed on the upper surface of the conductor on which a surface treatment is completed.

In an embodiment, the conductor may include at least one material selected from titanium (Ti), iron (Fe), nickel (Ni), copper (Cu), molybdenum (Mo), ITO, and IZO.

In an embodiment, the organic insulating layer may include at least one organic material selected from acryl resin, epoxy resin, phenolic resin, polyamide resin, and polyimide resin.

In an embodiment, the polishing the upper surface of the organic insulating layer may include using a chemical mechanical polishing method.

In an embodiment, the chemical mechanical polishing method may be performed by contacting a polishing pad to the upper surface of the organic insulating layer and supplying a slurry.

In an embodiment, the substrate may include a display area and a non-display area surrounding the display area, and the conductor may include a first conductor provided in the display area and a second conductor provided in the non-display area.

In an embodiment, the polishing pad may overlap the display area and the non-display area when the polishing pad contacts the upper surface of the organic insulating layer for the chemical mechanical polishing method.

In an embodiment, the manufacturing method may further include providing a pixel electrode, an emission layer, and a common electrode on the organic insulating layer in the display area, where the self-assembled monolayer may include a head group, a hydrocarbon chain, and a terminal functional group, the head group may include at least one selected from a siloxane, a thiol, and a phosphate, and the head group may be disposed between the pixel electrode and the first conductor.

According to embodiments, the sacrificial layer is provided on the surface of the organic insulating layer and the sacrificial layer is cleaned after the organic insulating layer polishing process, thereby providing the display device in which a slurry, polishing by-products, etc. are effectively prevented from remaining in the conductor.

In such embodiments, by forming the sacrificial layer on the surface of the conductor and performing the organic insulating layer polishing process, the conductor may be protected by not directly exposing the surface of the conductor to the polishing pad.

BRIEF DESCRIPTION OF THE DRAWINGS

The above and other aspects and features of the invention will become more apparent by describing in detail embodiments thereof with reference to the attached drawings, in which.

DETAILED DESCRIPTION

Figure 1:
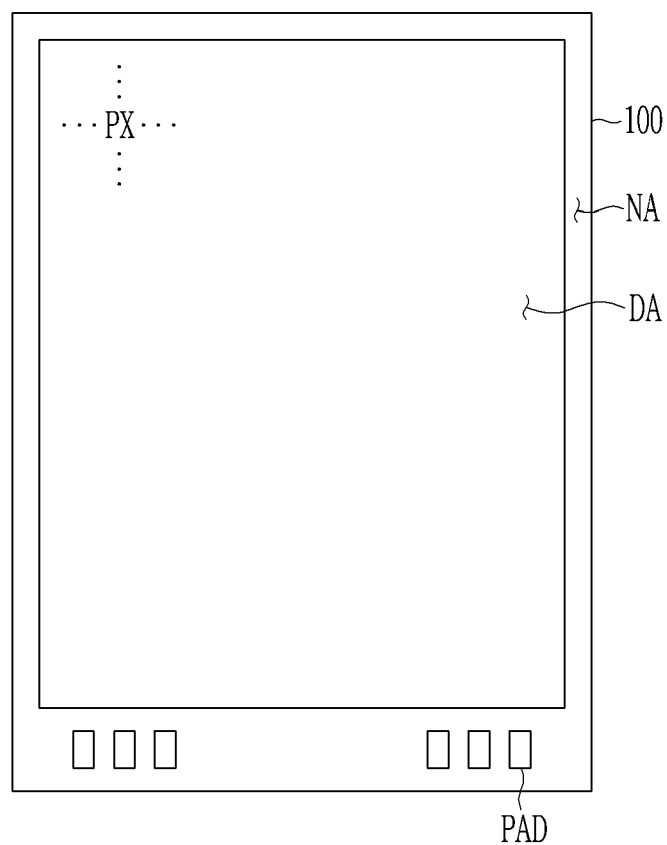
FIG. 1 is a schematic top plan view of a display device according to an embodiment.

The invention will be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification In the drawings, the sizes and thicknesses of the components are merely shown for convenience of explanation, and therefore the invention is not necessarily limited to the illustrations described and shown herein. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, herein, the phrase "in a plan view" means when an object portion is viewed from above, and the phrase "in a cross-section" means when a cross-section taken by vertically cutting an object portion is viewed from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Hereinafter, a display device according to an embodiment is described with reference to FIG. 1 to FIG. 3.

Figure 2:
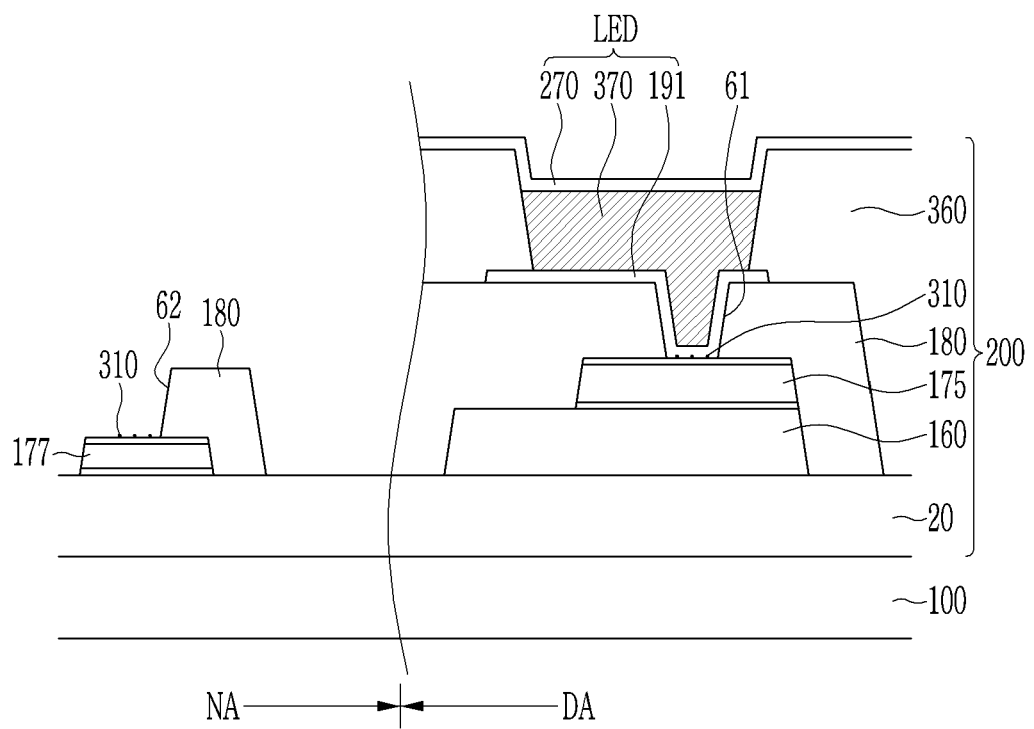
FIG. 2 is a cross-sectional view partially showing a display area and a non-display area of a display device according to an embodiment.

FIG. 1 is a schematic top plan view of a display device according to an embodiment, and FIG. 2 is a cross-sectional view partially showing a display area and a non-display area of a display device according to an embodiment. FIG. 3 is a structural view of a material forming a sacrificial layer of a display device according to an embodiment.

Referring to FIG. 1, an embodiment of a display device includes a display area DA and a non-display area NA.

The display area DA is an area in which an image is displayed by a plurality of pixels PX included therein, and the non-display area NA is an area in which the image is not displayed. The non-display area NA may be the area surrounding the display area DA. A plurality of pads PAD may be disposed in the non-display area NA. The pad PAD may be electrically connected to an external driving circuit element, a flexible printed circuit board ("PCB"), or a chip-on-film ("COF"). According to an embodiment, the non-display area NA in which the pad PAD is disposed may be bent.

In an embodiment, the display device may be an organic light emitting diode display including an organic light emitting element disposed in each pixel PX, but not being limited thereto. In an alternative embodiment, the display device may be a liquid crystal display.

Referring to FIG. 2, an embodiment of a display device includes a substrate 100 and a display element 200 disposed on the substrate 100. The display element 200 includes an inorganic insulating layer 160, conductors 175 and 177, a driving element including an organic insulating layer 180, and a light-emitting element LED.

The substrate 100 may be a flexible substrate 100 including or made of glass or a polymer such as polyimide ("PI"), polyamide ("PA"), and polyethylene terephthalate ("PET").

The inorganic insulating layer 160 and the first conductor 175 are disposed in the display area DA on the substrate 100, and the second conductor 177 is disposed in the non-display area NA on the substrate 100. The second conductor 177 may correspond to the pad PAD of FIG. 1, and may correspond to wiring disposed in the non-display area NA. The first conductor 175 and the second conductor 177 may be referred to as the conductors 175 and 177. A buffer layer (120 of FIG. 9) and a gate insulating layer (140 of FIG. 9) may be disposed in an element part 20 disposed between the substrate 100 and the inorganic insulating layer 160, a semiconductor layer (130 of FIG. 9) may be disposed between the substrate 100 and the buffer layer 120, and gate conductors 175 and 177 may be further disposed on the gate insulating layer 140. The inorganic insulating layer 160 may be disposed on the gate conductors 175 and 177. The configuration that may be disposed between the substrate 100 and the inorganic insulating layer 160 will be described later in greater detail with reference to FIG. 9.

The first conductor 175 and the second conductor 177 may have a single layer structure or a multi-layer structure, each layer including at least one metal selected from titanium (Ti), gold (Au), copper (Cu), nickel (Ni), silver (Ag), aluminum (Al), molybdenum (Mo), chromium (Cr), and tantalum (Ta), or their alloys. In one embodiment, for example, where the first conductor 175 and the second conductor 177 have a triple layer structure with an upper layer, an intermediate layer, and a lower layer, the upper layer may include at least one selected from titanium (Ti), iron (Fe), nickel (Ni), copper (Cu), molybdenum (Mo), indium tin oxide ("ITO"), and indium zinc oxide ("IZO").

In an embodiment, the organic insulating layer 180 may be disposed on the first conductor 175 and the inorganic insulating layer 160 in the display area DA. The organic insulating layer 180 for planarizing the surface of the substrate 100 including the display element may include at least one material selected from an acryl resin, an epoxy resin, a phenolic resin, a polyamide resin, and a polyimide resin. In an embodiment, the organic insulating layer 180 may be disposed in the non-display area NA to partially overlap the second conductor 177. The organic insulating layer 180 may planarize the upper portion of the pad PAD, the wiring, and the like to compensate for the step difference due to the pad PAD, the wiring, the driving unit, and the like.

In an embodiment, an opening 61 for exposing a part of the upper surface of the first conductor 175 may be defined or formed through the organic insulating layer 180. In such an embodiment, an opening 62 for exposing a part of the upper surface of the second conductor 177 may be defined or formed through the organic insulating layer 180. In an embodiment, at least one material selected from a siloxane, a thiol, a phosphate, a disulfide including sulfur series, and an amine may be disposed on the conductors 175 and 177 exposed by the openings 61 and 62 of the organic insulating layer 180. At least one material selected from a siloxane, a thiol, a phosphate, a disulfide including a sulfur series, and an amine, as a material configuring a head group 310 of a sacrificial layer 300, which will be described later in greater detail, may not be completely removed by a cleaning process of the sacrificial layer 300, but may partially remain on the conductors 175 and 177. In such an embodiment, where the at least one material selected from a siloxane, a thiol, a phosphate, a disulfide including a sulfur series, and an amine remains above the conductors 175 and 177, electrical performance of the conductors 175 and 177 may not affected thereby.

A pixel electrode 191 is disposed on the organic insulating layer 180. In the display area DA, the pixel electrode 191 may be electrically connected to the first conductor 175 through the opening 61 of the organic insulating layer 180. The first conductor 175 may be a drain electrode of a transistor. The at least one material selected from a siloxane, a thiol, a phosphate, a disulfide including a sulfur series, and an amine may be disposed between the pixel electrode 191 and the first conductor 175. However, such materials do not affect the electrical connection between the pixel electrode 191 and the first conductor 175.

A partition 360 is disposed on the pixel electrode 191 and the organic insulating layer 180, and an opening 361 for exposing a part of the pixel electrode 191 is defined or formed through the partition 360. An emission layer 370 is disposed in the opening 361 of the partition 360, and a common electrode 270 is disposed on the emission layer 370. The pixel electrode 191, the emission layer 370, and the common electrode 270 may constitute or collectively define the light-emitting element LED.

The material remaining on the upper surfaces of the conductors 175 and 177 of FIG. 2 correspond to a material forming the sacrificial layer 300 described later. In an embodiment, the sacrificial layer 300 is a self-assembled monolayer. Here, the self-assembled monolayer refers to a regularly ordered organic molecular film spontaneously coated on the surface of a given substrate. The self-assembled monolayer may include an organic silicon, or thiol-based, amine-based, or silane-based organic materials. In one embodiment, for example, trichloro[1H,1H,2H,2H-perfluorooctyl] silane ($CF_3CF_{25}CH_2CH_2SiCl_3$) or dodecanethiol ($CH_3(CH_2)_{11}SH$) may be used as the self-assembled monolayer.

Figure 3:
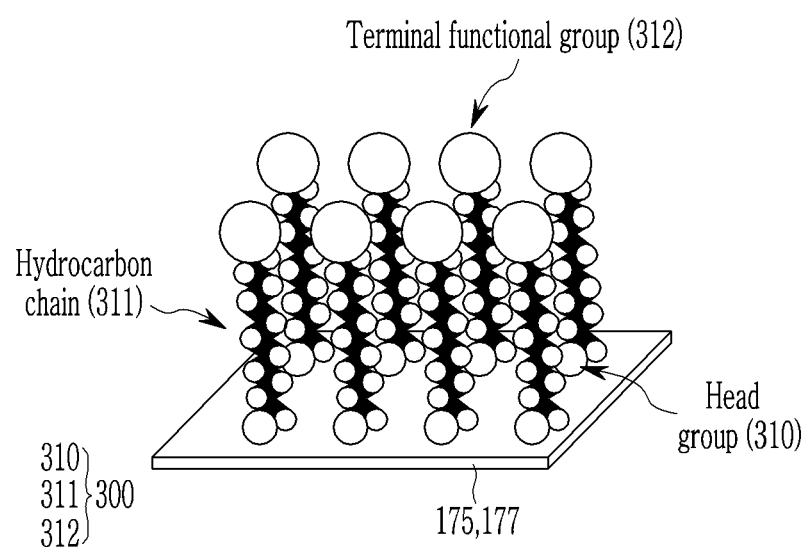
FIG. 3 is a structural view of a material forming a sacrificial layer of a display device according to an embodiment.

Referring to FIG. 3, the self-assembled monolayer includes the head group 310, a hydrocarbon chain 311, and a terminal functional group 312.

The head group 310 may include at least one material selected from a siloxane, a thiol, a phosphate, a disulfide including a sulfur series, and an amine, and the terminal functional group 312 may include at least one material selected from a trifluoromethyl (—$CF_3$), a difluorocarbene (—$CF_2$), a methyl (—$CH_3$), a methylene (—$CH_2$), a fluoro (—F), a hydroxyl group (—OH), carbon (—C), and silicon (—Si). In an embodiment, the head group 310 may be defined by a material capable of maximizing bonding strength with a metal, and the terminal functional group 312 may be a hydrophobic material. The head group 310 may have a large selection ratio to be specific to the metal. Therefore, the head group 310 is bonded to the metal body, and the terminal functional group 312 is disposed in the opposite direction of the metal body, so that a repulsive force may be applied to a water-soluble material. The metal combined with the head group 310 may be at least one metal selected from titanium (Ti), gold (Au), copper (Cu), nickel (Ni), silver (Ag), aluminum (Al), molybdenum (Mo), chromium (Cr), iron (Fe), ITO, IZO, tantalum (Ta), and a combination (e.g., an alloy) thereof, and the water-soluble material acting with the repulsive force with the terminal functional group 312 may be a slurry. The self-assembled monolayer may be formed by a reduction removal reaction of hydrogen after an oxidation addition reaction for the surface of the metal.

Hereinafter, an embodiment of a manufacturing method of the display device using the self-assembled monolayer will be described in detail with reference to FIG. 4 to FIG. 8.

FIG. 4 to FIG. 8 are views showing a manufacturing method of a display device according to an embodiment.

Figure 4:
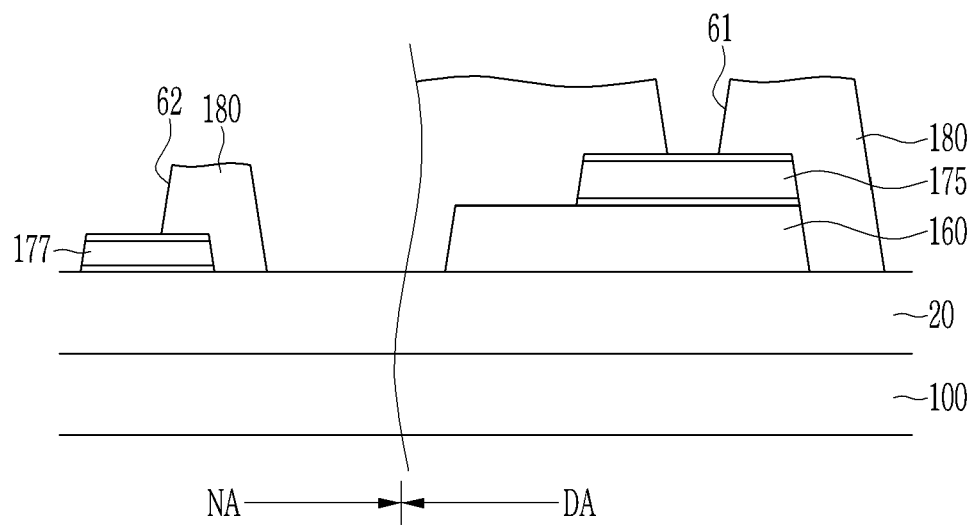
FIG. 4 to FIG. 8 are views showing a manufacturing method of a display device according to an embodiment.

Referring to FIG. 4, in an embodiment of a manufacturing method of the display device, an element part 20, an inorganic insulating layer 160, conductors 175 and 177, and an organic insulating layer 180 are sequentially provided or formed on a substrate 100.

The first conductor 175 is provided or formed in a display area DA on a substrate 100, the inorganic insulating layer 160 is provided or formed on the first conductor 175, and the organic insulating layer 180 is provided or formed on the inorganic insulating layer 160. The second conductor 177 is provided or formed in the non-display area NA on the substrate 100, and the organic insulating layer 180 is provided or formed on the second conductor 177.

In an embodiment where the organic insulating layer 180 is formed in a state in which the composition of the organic layer is coated and cured, the upper surface may include protrusions and depressions. The organic insulating layer 180 may be partially patterned with openings 61 and 62 exposing parts of the upper surfaces of the conductors 175 and 177. The organic insulating layer 180 may include at least one organic material selected from an acryl resin, an epoxy resin, a phenolic resin, a polyamide resin, and a polyimide resin, and the composition of the organic layer may be mainly cured at the positions corresponding to the openings 61 and 62.

Figure 5:
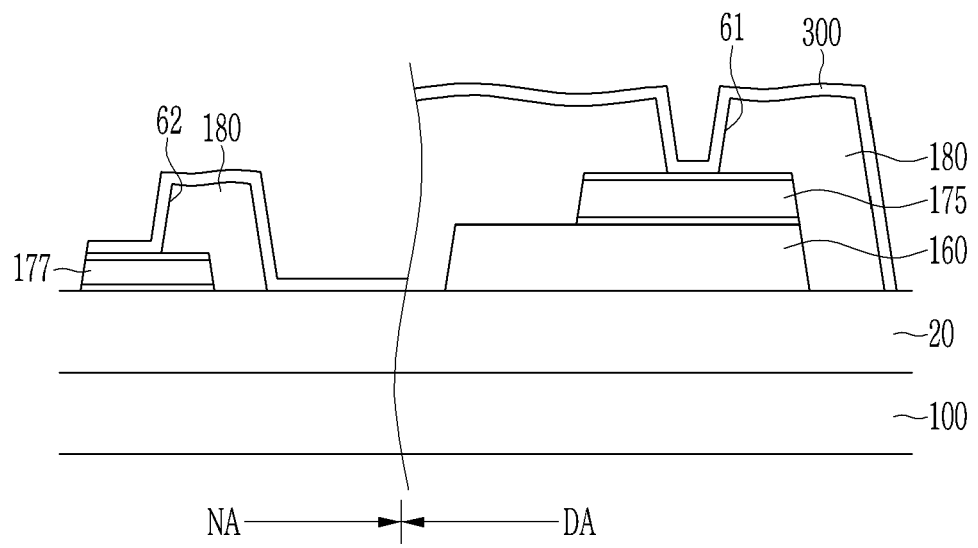

Referring to FIG. 5, a sacrificial layer 300 is provided or deposited to cover the portion where the surfaces of the organic insulating layer 180 and the upper surface of the conductor 175 and 177 are exposed.

The sacrificial layer 300 may be provided or formed using the self-assembled monolayer shown in FIG. 3. The sacrificial layer 300 may be formed by a deposition process such as a thermal evaporation, a liquid coating, a chemical vapor deposition ("CVD"), a physical vapor deposition ("PVD"), or a sputtering. The sacrificial layer 300 may protect the conductors 175 and 177 in the process of polishing the organic insulating layer 180.

It is desired to perform the process of polishing the protrusions and depressions of the upper surface of the organic insulating layer 180 to provide a flat upper surface. The upper surface of the organic insulating layer 180 may be polished and simultaneously the sacrificial layer 300 positioned on the upper surface of the organic insulating layer 180 may also be polished. The polishing process may be performed using a chemical mechanical polishing method in which the mechanical polishing and the chemical polishing are performed together. A chemical mechanical polishing is a method in which the substrate 100 is rotated in contact with the polishing pad to be polished and simultaneously a slurry for the chemical polishing is supplied. The material contained in the slurry is a compound that may mechanically cut the surfaces such as the substrate 100 and the insulating layer or cut into abrasive particles. The slurry includes a material that chemically suppresses the polishing of the pattern of the conductors 175 and 177 at pH 6.0 or higher, so that the organic insulating layer 180 is polished, but the conductors 175 and 177 may have a material selection ratio at which the polishing is suppressed. It may be desired to perform the polishing process using the polishing pad having a wide width overlapping the display area DA and the non-display area NA to be in contact with both display area DA and non-display area NA. In this case, due to the step of the organic insulating layer 180 of the display area DA and the non-display area NA, the polishing pad may be in direct contact with the upper surface of the pad PAD part such that the pad PAD may be damaged. In addition, after the polishing process, the openings 61 and 62 of the organic insulating layer 180 may not be cleaned well, so that the slurry of the upper surface of the conductors 175 and 177 may not be removed.

In an embodiment of the invention, the sacrificial layer 300 is provided or deposited on the surface of the organic insulating layer 180 and the pad PAD, such that the pad PAD may be effectively prevented from being damaged in the polishing process.

In such an embodiment, the slurry may be effectively removed in the openings 61 and 62 of the organic insulating layer 180.

Figure 6:
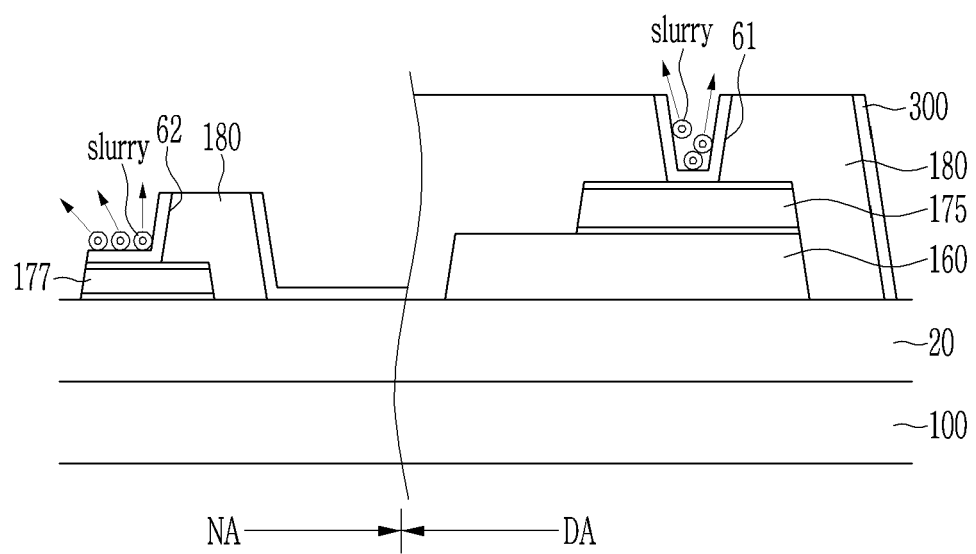

Referring to FIG. 6, after the polishing process is performed, the surface of the organic insulating layer 180 is cleaned to remove the slurry and the polishing by-products, for example. The sacrificial layer 300 formed on the side surface of the organic insulating layer 180 and the upper surface of the conductor 175 and 177 is removed by the surface treatment.

By the polishing process, the upper surface of the organic insulating layer 180 has been planarized, but the slurry may remain on the sacrificial layer 300 in the openings 61 and 62 of the organic insulating layer 180. In addition, the slurry may also remain on the sacrificial layer 300 disposed on the upper surfaces of the conductors 175 and 177. The sacrificial layer 300 may be removed from the organic insulating layer 180 and the conductor 175 and 177 by the surface treatment. In an embodiment, by removing the slurry remaining on the surface of the sacrificial layer 300 along with the removal of the sacrificial layer 300, the display device may be manufactured without remaining the slurry in the opening of the organic insulating layer 180 and the upper surfaces of the conductors 175 and 177. The surface treatment may use atmospheric pressure plasma or plasma discharge, and argon (Ar), oxygen ($O_2$), or nitrogen ($N_2$) may be used as a plasma reaction gas thereof.

Figure 7:
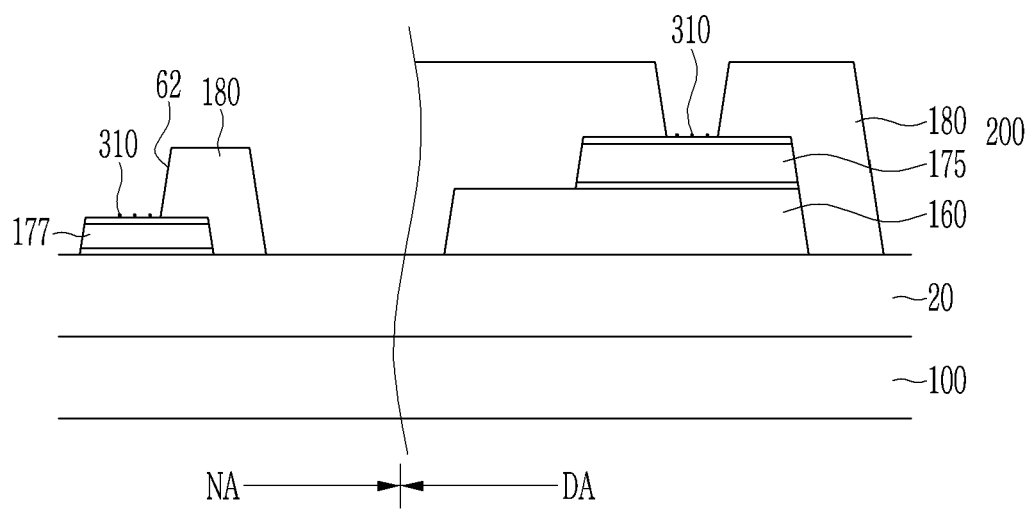

Referring to FIG. 7, the head group 310 of the sacrificial layer 300 may be disposed on the upper surface of the conductors 175 and 177 to which the surface treatment is completed.

In an embodiment, the bonding strength of the head group 310 and the surfaces of the conductors 175 and 177 is greater than that of the head group 310 and the hydrocarbon chain 311, the head group 310 may remain on the upper surfaces of the conductors 175 and 177. In such an embodiment, the head group 310 disposed on the upper surfaces of the conductors 175 and 177 has a fineness degree of about 1 Å, all the sacrificial layer 300 may be cleaned without remaining other material except for the head group 310 on the upper surfaces of the conductors 175 and 177. In an embodiment, the portion of the sacrificial layer 300 may remain on the upper surface of the organic insulating layer 180, but most of the sacrificial layer 300 may be easily removed since the bonding strength of the head group 310 and the organic insulating layer 180 is not greater than that of the head group 310 and the hydrocarbon chain 311.

Figure 8:
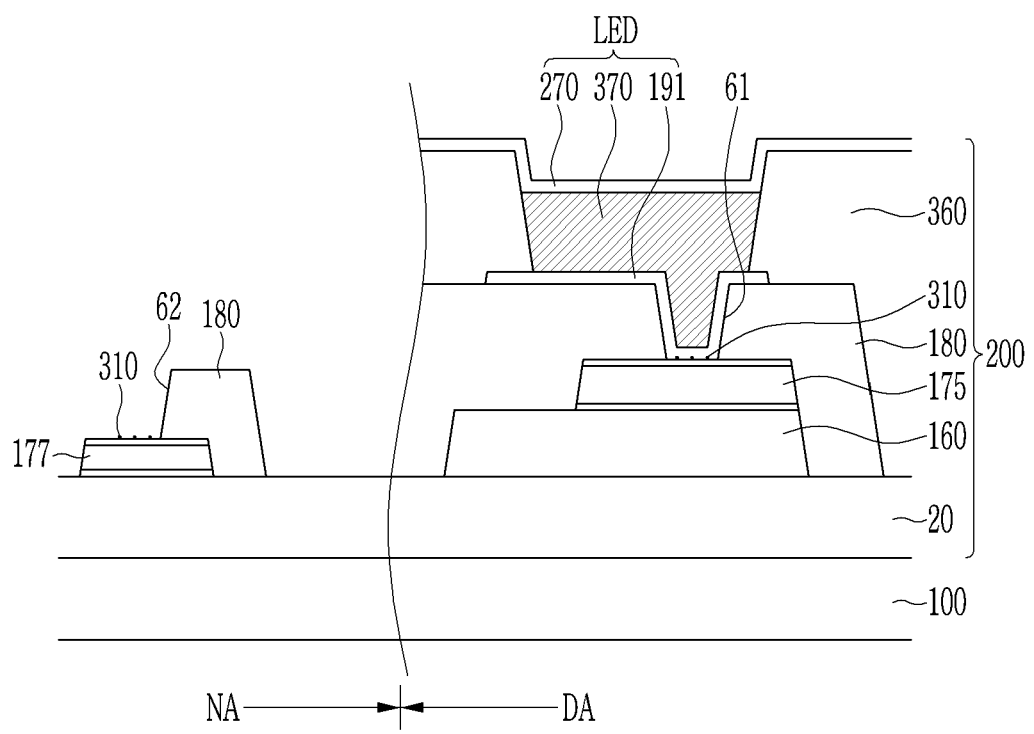

Referring to FIG. 8, in the display area DA, a pixel electrode 191 and a partition 360 are provided or formed on the organic insulating layer 180, an emission layer 370 is provided or formed on the pixel electrode 191, and a common electrode 270 is provided or formed on the emission layer 370 and the partition 360.

Since the upper surface of the organic insulating layer 180 is substantially flat, the thickness of the pixel electrode 191 and the emission layer 370 disposed on the organic insulating layer 180 may be easily controlled. Accordingly, a high resolution display device may be realized, the luminance of light emitted by the light-emitting element may be uniform, and the pattern inside the display device may be effectively prevented from being viewed from the outside.

Hereinafter, the display area of an embodiment of the display device according to the invention will be described with reference to FIG. 9.

Figure 9:
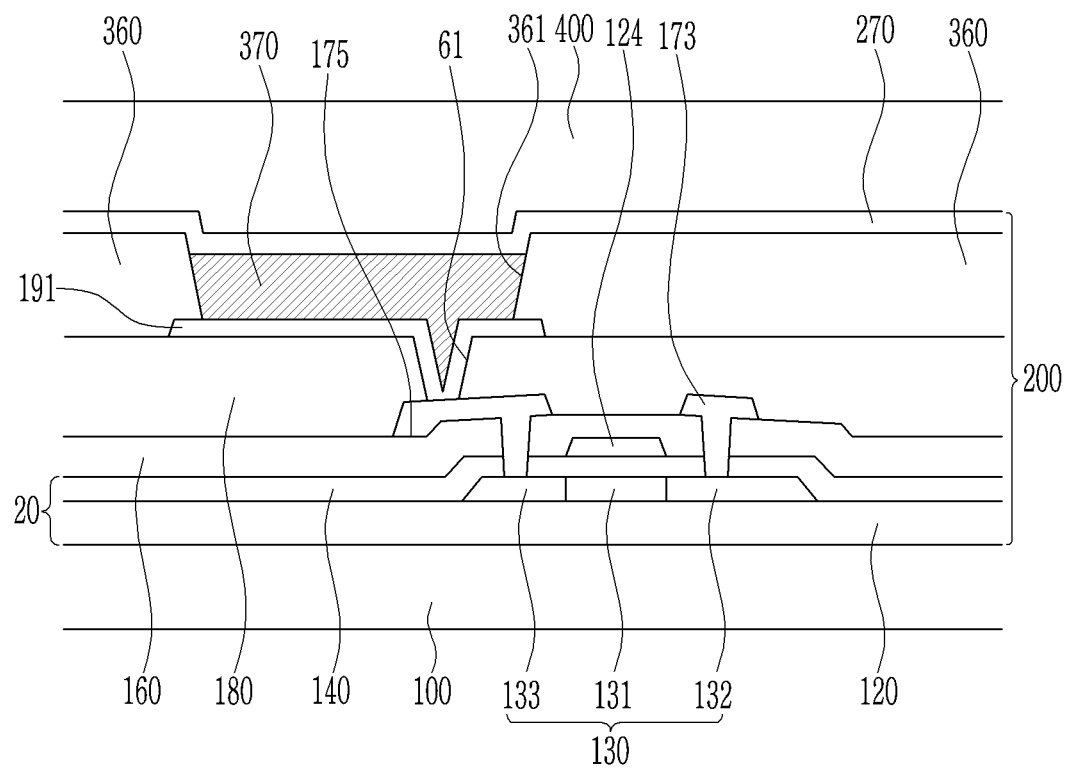
FIG. 9 is a schematic cross-sectional view of a display device according to an embodiment.

FIG. 9 is a schematic cross-sectional view of a display device according to an embodiment. FIG. 9 is the cross-sectional view to show a stacked structure of the display area in the display device according to an embodiment, and may schematically correspond to one pixel area.

In an embodiment, the display device includes a substrate 100, transistors 124, 130, 173, and 175 disposed on the substrate 100, and a light-emitting element LED connected to the transistors 124, 130, 173, and 175. A part of the transistor may be included in an element part 20 shown in FIG. 2 to FIG. 8.

The substrate 100 may be a flexible substrate 100, and may include a barrier layer to prevent moisture, oxygen, etc. from penetrating from an outside.

In an embodiment of the display device, a buffer layer 120 is disposed on the substrate 100. The buffer layer 120 may block the impurity that may be diffused from the substrate 100 to the semiconductor layer 130 in the process of forming the semiconductor layer 130 and reduce the stress applied to the substrate 100. The barrier layer and the buffer layer 120 may include an inorganic insulating material such as a silicon oxide ($SiO_x$), a silicon nitride ($SiN_x$), etc.

In an embodiment of the display device, a semiconductor layer 130 of the transistor is disposed on the buffer layer 120, and a gate insulating layer 140 is disposed on the semiconductor layer 130. The semiconductor layer 130 includes a source region 132 and a drain region 133, and a channel region 131 between these regions. The semiconductor layer 130 may include a polysilicon, an oxide semiconductor or an amorphous silicon, for example.

In an embodiment of the display device, a gate conductor including a gate electrode 124 of the transistor, a gate line, etc., may be disposed on the gate insulating layer 140. The gate conductor may include a metal such as molybdenum (Mo), copper (Cu), aluminum (Al), silver (Ag), chromium (Cr), tantalum (Ta), titanium (Ti), or a metal alloy thereof.

In an embodiment of the display device, an inorganic insulating layer 160 is disposed on the gate electrode 124. The inorganic insulating layer 160 may be an interlayer insulating layer including an inorganic insulating material.

In an embodiment of the display device, data conductors 173 and 175 including a source electrode 173 and a drain electrode 175 of the transistor, a data line, and a driving voltage line may be disposed on the inorganic insulating layer 160. The source electrode 173 and the drain electrode 175 may be respectively connected to the source region 132 and the drain region 133 of the semiconductor layer 130 through openings in the gate insulating layer 140 and the inorganic insulating layer 160. The data conductors 173 and 175 may include a metal, such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), ITO and IZO, or a metal alloy thereof.

In an embodiment of the display device, an organic insulating layer 180 may be disposed on the inorganic insulating layer 160 and the data conductors 173 and 175. The organic insulating layer 180 may have a flat surface on which the light-emitting element LED is to be disposed to increase the light emission efficiency of the light-emitting element LED disposed thereon.

In an embodiment of the display device, the light-emitting element LED including the pixel electrode 191, the emission layer 370, and the common electrode 270 disposed on the light-emitting element LED is disposed on the organic insulating layer 180.

In an embodiment of the display device, an encapsulation layer 400 may be disposed on the light-emitting element LED. The encapsulation layer 400 encapsulates the light-emitting element LED to prevent moisture or oxygen from penetrating from the outside. The encapsulation layer 400 may include at least one inorganic material layer and at least one organic material layer, and the inorganic material layer and the organic material layer may be alternately stacked.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate;
an inorganic insulating layer disposed on the substrate;
a conductor disposed on the inorganic insulating layer; and
an organic insulating layer disposed on the conductor, wherein an opening is defined through the organic insulating layer to exposes a part of an upper surface of the conductor, and
at least one material selected from a siloxane, a thiol, a phosphate, a disulfide including a sulfur series, and an amine is bonded on the part of the upper surface of the conductor exposed through the opening.

2. The display device of claim 1, wherein
the conductor includes at least one material selected from titanium (Ti), iron (Fe), nickel (Ni), copper (Cu), molybdenum (Mo), indium tin oxide, and indium zinc oxide.

3. The display device of claim 2, wherein
the substrate includes a display area and a non-display area surrounding the display area, and
the conductor includes a first conductor disposed in the display area and a second conductor disposed in the non-display area.

4. The display device of claim 3, further comprising,
a pixel electrode disposed on the organic insulating layer in the display area;
an emission layer disposed on the pixel electrode in the display area; and
a common electrode disposed on the emission layer in the display area,
wherein the at least one material selected from the siloxane, the thiol, the phosphate, the disulfide including the sulfur series, and the amine is disposed between the pixel electrode and the first conductor.

5. The display device of claim 4, further comprising,
a semiconductor layer disposed on the substrate in the display area;
a gate insulating layer disposed on the semiconductor layer in the display area;
a gate conductor disposed on the semiconductor layer in the display area; and
a data conductor disposed on the gate conductor in the display area,
wherein the data conductor is defined by the first conductor, and
the inorganic insulating layer is disposed between the gate conductor and the data conductor.

6. The display device of claim 5, wherein
the first conductor is electrically connected to the pixel electrode through the opening of the organic insulating layer.

7. The display device of claim 6, wherein
the at least one material selected from a siloxane, a thiol, a phosphate, a disulfide including a sulfur series, and an amine is disposed between the pixel electrode and the first conductor.

8. The display device of claim 5, wherein
the gate conductor includes a gate electrode,
the data conductor includes a drain electrode and a source electrode, and
the gate electrode, the drain electrode, the source electrode, and the semiconductor layer collectively define a transistor.

9. The display device of claim 3, wherein
the second conductor is electrically connected to at least one of an external driving circuit element, a flexible printed circuit board, and a chip-on-film ("COF").

10. The display device of claim 1, wherein
the conductor has a triple layer structure with an upper layer, an intermediate layer, and a lower layer.

11. The display device of claim 10, wherein
the upper layer includes at least one material selected from titanium (Ti), iron (Fe), nickel (Ni), copper (Cu), molybdenum (Mo), indium tin oxide, and indium zinc oxide.

12. The display device of claim 1, wherein
the organic insulating layer includes at least one organic material selected from acryl resin, epoxy resin, phenolic resin, polyamide resin, and polyimide resin.

* * * * *